(12) United States Patent
Huber et al.

(10) Patent No.: US 6,815,994 B2
(45) Date of Patent: Nov. 9, 2004

(54) METHOD OF SCALING DIGITAL CIRCUITS AND CONTROLLING THE TIMING RELATIONSHIP BETWEEN DIGITAL CIRCUITS

(75) Inventors: Brian W. Huber, Allen, TX (US); David R. Brown, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 253 days.

(21) Appl. No.: 10/007,871

(22) Filed: Nov. 13, 2001

(65) Prior Publication Data

US 2002/0089885 A1 Jul. 11, 2002

Related U.S. Application Data

(62) Division of application No. 09/649,970, filed on Aug. 28, 2000, now Pat. No. 6,420,920.

(51) Int. Cl.[7] .............................................. H03H 11/16
(52) U.S. Cl. ...................... 327/257; 327/239; 327/256; 327/258
(58) Field of Search .............................. 327/257, 239, 327/258, 256

(56) References Cited

U.S. PATENT DOCUMENTS

| | | | |
|---|---|---|---|
| 4,044,317 A | | 8/1977 | Newell et al. .......... 331/116 R |
| 5,311,084 A | * | 5/1994 | Gabara ....................... 327/170 |
| 5,592,115 A | | 1/1997 | Kassapian .................. 327/239 |
| 5,637,998 A | | 6/1997 | Kushihara .............. 324/207.25 |
| 5,852,378 A | | 12/1998 | Keeth .......................... 327/171 |
| 5,867,043 A | | 2/1999 | Kim ............................ 327/257 |
| 5,874,845 A | * | 2/1999 | Hynes ......................... 327/259 |
| 6,292,042 B1 | | 9/2001 | Kim et al. ................... 327/257 |
| 6,420,920 B1 | * | 7/2002 | Huber et al. ................ 327/257 |
| 6,424,208 B1 | * | 7/2002 | Pinai ........................... 327/554 |
| 6,486,719 B2 | * | 11/2002 | Kim ............................ 327/199 |

FOREIGN PATENT DOCUMENTS

JP         2001094540 A        4/2001

OTHER PUBLICATIONS

Chinnery, D.G. et al., "Achieving 550 MHz in an ASIC Methodology," Department of EECS, University of California at Berkeley, 2001, 6 pages.

(List continued on next page.)

Primary Examiner—Viet Q. Nguyen
(74) Attorney, Agent, or Firm—Dorsey & Whitney LLP

(57) ABSTRACT

A phase splitter is formed by first and second branches that generate respective first and second complimentary output clock signals from an input clock signal. The first branch includes two series connected inverters, the first of which receives the input clock signal and the second of which outputs a non-complimentary output clock signal. The second branch includes three series connected inverters, the first of which receives the input clock signal and the third of which outputs a complimentary output clock signal. An inverter is coupled from the output of the second inverter in the second branch to the output of the first inverter in the first branch to increase the slew rate of the signal applied to the input of the second inverter. In one embodiment, first and second parallel pairs of diode-coupled transistors are coupled from the output of the third inverter in the second branch to the outputs of respective first inverters in the first and second branches. In another embodiment, the second branch includes five series connected inverters, and the first and second pairs of diode-coupled transistors are coupled from the outputs of the third and fifth inverters, respectively, in the second branch. These diode-coupled transistors compensate for process variations in the transistors used in the inverters in each branch.

10 Claims, 4 Drawing Sheets

OTHER PUBLICATIONS

Friedman, Eby G., "*Clock Distribution Networks in Synchronous Digital Integrated Circuits*," Invited Paper, IEEE, vol. 89, No. 5, May 2001, pp. 665–692.

Friedman, Eby G. et al., "*Design and Analysis of a Hierarchical Clock Distribution System for Synchronous Standard Cell/Macrocell VLSI*," IEEE, vol. SC–21, No. 2, Apr. 1986, pp. 240–246.

IBM, "*Method of Deskewing Data Pulses*," IBM Technical Disclosure Bulletin, vol. 28, No. 6, Nov. 1985, ppl. 2658–2659.

Montanaro, James et al., "*A 160–MHz, 32–b, 0.5–W CMOS RISC Microprocessor*," IEEE, vol. 31, No. 11, Nov. 1996, pp. 1703–1714.

Nomura, Masahiro et al., "*A 300–MHz 16–b, 0.5–µm BiCMOS Digital Signal Processor Core LSI*," IEEE, vol. 29, No. 3, Mar. 1994, pp. 290–297.

Tokumaru, Takeji et al., "*Design of a 32–bit Microprocessor, TX1*," IEEE, vol. 24, No. 4, Aug. 1989, pp. 938–944.

\* cited by examiner

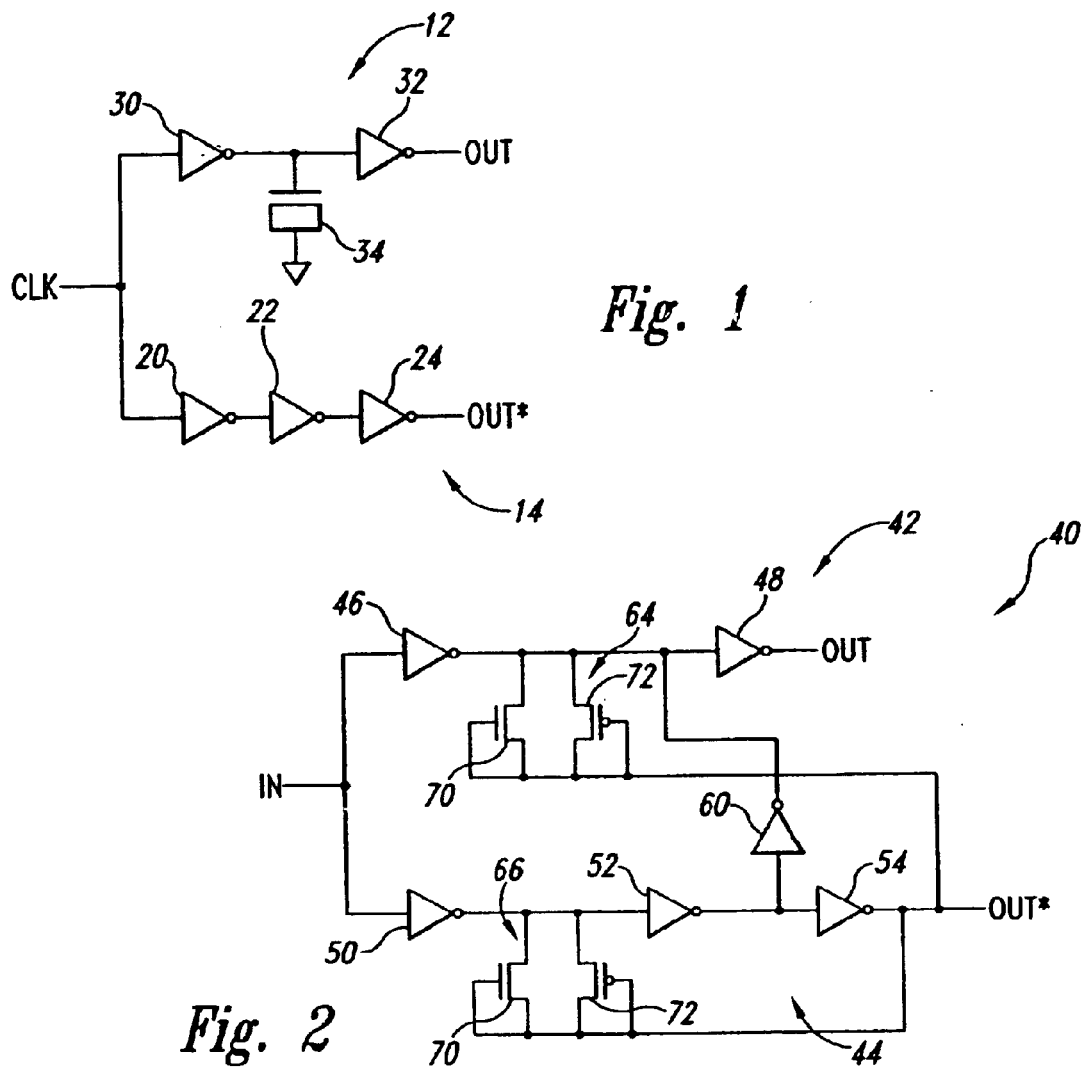
Fig. 1
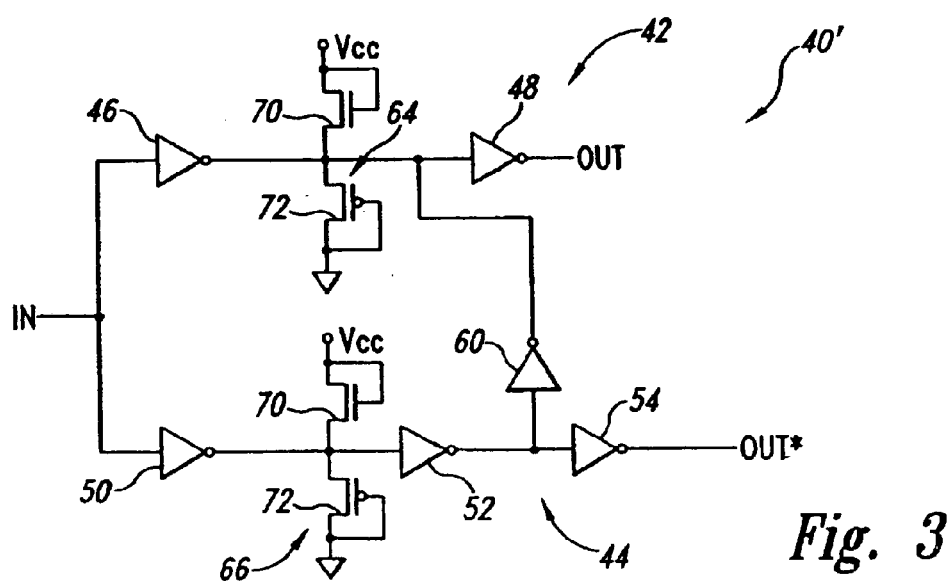
Fig. 2
Fig. 3

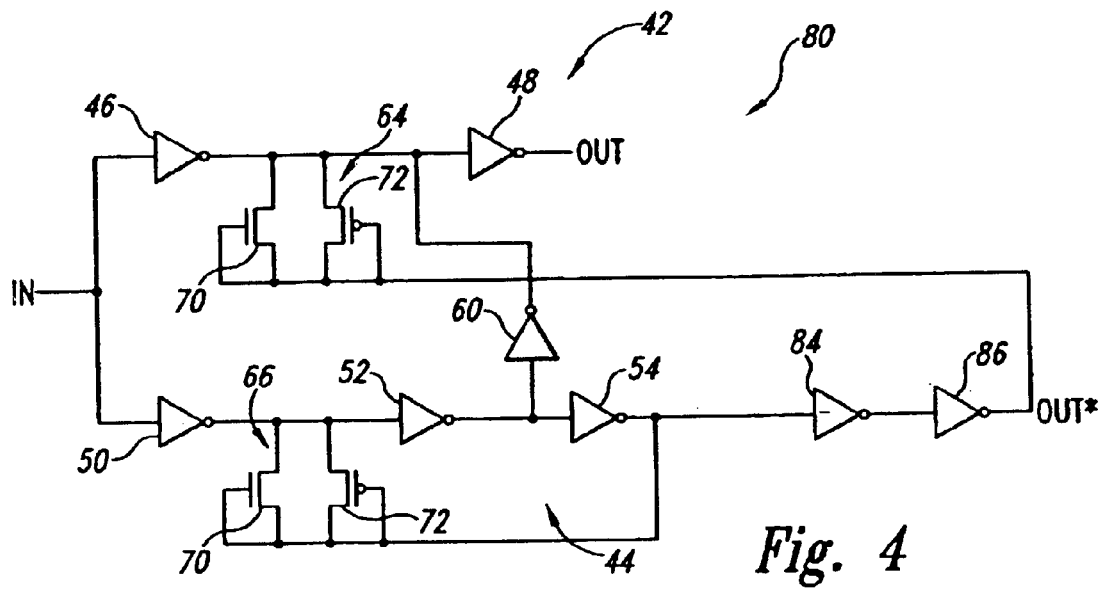
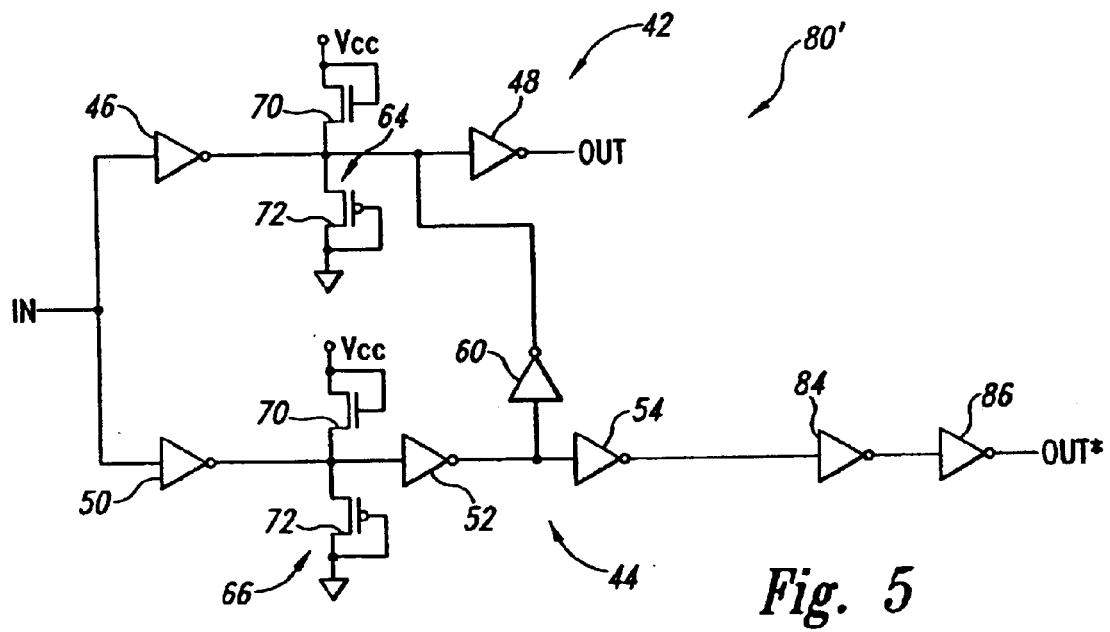

METHOD OF SCALING DIGITAL CIRCUITS AND CONTROLLING THE TIMING RELATIONSHIP BETWEEN DIGITAL CIRCUITS

CROSS-REFERENCE TO RELATED APPLICATION

This application is a divisional of U.S. patent application Ser. No. 09/649,970, filed Aug. 28, 2000 now U.S. Pat. No. 6,420,920.

TECHNICAL FIELD

The invention relates to clocking circuits, and more particularly to circuits for generating a clock signal and a symmetrical complement of the clock signal.

BACKGROUND OF THE INVENTION

Clock signals are commonly used in digital circuits, including circuits used in memory devices, to control the timing at which various events occur. In some cases, a single clock signal is used. However, in other cases, it is necessary to use both the clock signal and the complement of the clock signal. The signals are typically generated by applying a clock signal to a phase splitter, which then generates a clock signal and its complement for use by the digital circuit.

It is important that the clock signal and its complement be symmetrical, i.e., the edges of both signals be substantially aligned and have the same slew rate. The clock signal and its complement generated by an ideal phase splitter would have a 50 percent duty cycle, equal rise and fall times and they would be exactly 180 degrees out of phase from each other. In practice, the ideal is rarely achieved for a variety of reasons, including process variations in the fabrication of the phase splitter. For example, for a CMOS process, one pass of the process may result in an inverter having a fast NMOS transistor and a slow PMOS transistor, and another pass of process may result in the inverter having a slow NMOS transistor and a fast PMOS transistor. As a result, the inverters will respond differently to incoming clock signal, and the respective clock signals generated by the inverters will not be symmetrical.

A conventional phase splitter 10 is illustrated in FIG. 1. The phase splitter 10 includes two branches 12, 14, one of which generates a signal OUT and the other which generates its complement OUT*. The second branch 14 consists of three inverters 20, 22, 24. Since there are an odd number of inverters in the second branch 14, the complementary output signal OUT* is the complement of the input signal CLK, but delayed in time by the sum of the propagation delays through each of the inverters 20–24.

The first branch 12 consists of two inverters 30, 32 and a capacitor 34 connected to the output of the first inverter 30. The size of the capacitor 34 is selected to delay the coupling of all of signals from the output of the first inverter 30 to the input of the second inverter 32 by an amount corresponding to the difference between the delay of the three inverters 20–24 and the two inverters 30, 32. As a result, the OUT signal and the OUT* signal are theoretically 180 degrees out of phase with each other. In practice, however, the OUT and OUT* may not be entirely symmetrical for several reasons. For example, although the capacitor 34 compensates for the delay of the extra inverter in the second branch 14, it also reduces the slew rate of the signal applied to the input of the inverter 32. As a result, the slew rate of the signal applied to the inverter 32 is substantially slower than the slew rate of the signal applied to the inverter 24. This difference in slew rates causes the rise and fall times of the signals OUT and OUT* to differ substantially from each other.

Proposals have been made to modify the prior art phase splitter 10 shown in FIG. 1 by dispensing with the capacitor 34 and instead adjusting the delay of each of the inverters 20–24, 30, 32 to achieve substantially the same result. More specifically, the inverters 20, 24 and 30 may be designed so that the sum of the delays through the inverters 20, 24 is equal to the delay through the inverter 30. The inverters 22 and 32 are then designed so that they have equal propagation delays. As a result, the signals OUT and OUT* are, in theory, symmetrical. Again, in practice, the signals are anything but symmetrical for several reasons. For example, the inverters 20, 24 must be relatively fast so that the sum of their delays is equal to the delay of the inverter 30. The high-speed of the inverter 24 causes it to have a relatively high slew rate. In order for the slew rate of the OUT signal to match the slew rate of the OUT* signal, the transistors used in the inverter 32 must be relatively large. However, the inverter 30 must be fairly slow to achieve the required delay, and, as a result, its output signal has a relatively low slew rate. The low slew rate of the inverter 30 makes it all the more difficult for the output of the inverter 32 to match the output of the inverter 24 so that OUT and OUT* will have the same rise and fall times. If the slew rate of the inverter 24 is decreased to match the slew rate of the inverter 32, the speed of the inverter 32 will also be reduced. As a result, is necessary to increase the speed of the inverter 20 by a commensurate amount, thereby making the inverter 20 very large. In addition to consuming a relatively large area of the substrate, making the inverter 20 large decreases the input impedance of the inverter 20 making it difficult for other circuits (not shown) to drive the inverter 20.

A need therefore exists for a phase splitter that uses relatively little circuitry consuming relatively little area on a substrate that produces from a clock signal complementary signals that are substantially symmetrical in both phase and slew rate despite fabrication processing variations.

SUMMARY OF THE INVENTION

A phase splitter in accordance with the invention is operable to generate first and second complimentary output clock signals from an input clock signal. The phase splitter includes two branches receiving the input clock signal and generating the respective output clock signals. The first branch includes an even number of series connected inverters while the second branch includes an odd number of series connected inverters. In one aspect of the invention, an inverter is coupled between an output of an inverter in the first branch that is N number of inverters from the input clock signal and an output of an inverter in the second branch that is N+1 number of inverters from the input clock signal, where N is a positive integer, and where the added inverter's input is on the second branch and its output is on the first branch. Cross-coupling signals between the first and second branches in this manner provides delay but subsequently has increased the slew rate of the signal applied to an input of one of the inverters. In another aspect of the invention, a first pair of diode-connected transistors are coupled between an output of one of the inverters in the first branch that is M inverters from the input clock signal, and M+P inverters in either branch, to make the phase splitter substantially insensitive to process variations. M is a positive integer and P is positive even number. For the same reason, a second pair of diode-connected transistors are coupled between an output of one of the inverters in the second branch that is M inverters from the input clock signal, and M+P inverters in either branch.

BRIEF DESCRIPTION OF THE DRAWINGS

FIG. 1 is a logic diagram of a conventional phase splitter.

FIG. 2 is a logic diagram of a phase splitter according to one embodiment of the invention.

FIG. 3 is a logic diagram of a phase splitter according to another embodiment of the invention that is similar to the embodiment of FIG. 2.

FIG. 4 is a logic diagram of a phase splitter according to another embodiment of the invention.

FIG. 5 is a logic diagram of a phase splitter according to another embodiment of the invention that is similar to the embodiment of FIG. 4.

DETAILED DESCRIPTION OF THE INVENTION

Figure 6:
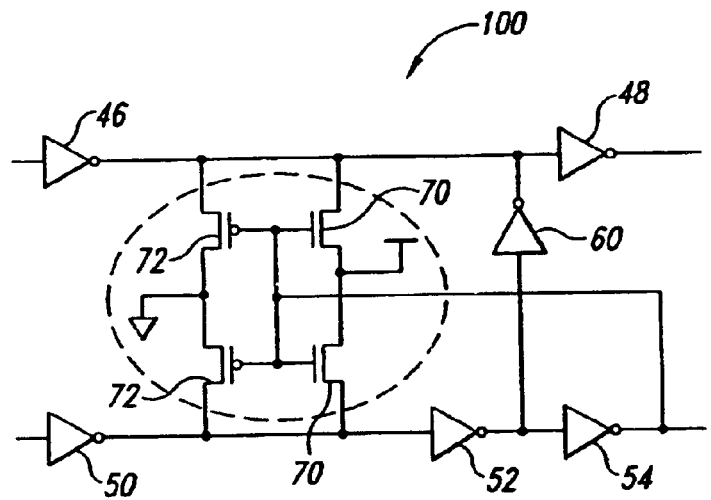
FIG. 6 is a logic diagram of phase splitters according to another embodiment of the invention.

A phase splitter 40 in accordance with one embodiment of the invention is illustrated in FIG. 2. Like the prior art phase splitter 10 shown in FIG. 1, the phase splitter 40 includes two branches 42, 44 that generate OUT and OUT* signals, respectively. The first branch 42 includes two inverters 46, 48, while the second branch 44 includes three inverters 50, 52, 54. The phase splitter 40 differs from the prior art phase splitter 12 shown in FIG. 1 in two primary respects. First, it includes an inverter 60 coupled from the output of the inverter 52 to the input of the inverter 48. Second, the phase splitter 40 includes first and second pairs 64, 66 of diode-coupled transistors coupled from the output of the inverter 54 to the input of the inverter 48 and the input of the inverter 52, respectively. Each transistor pair 64, 66 includes an NMOS transistor 70 with its "anode" coupled to the output of the inverter 54 and a PMOS transistor 72 with its "cathode" coupled to the output of the inverter 54.

In operation, assume that the input signal IN is low. As a result, the output of the inverter 46 will be high and the output of the inverter 48 will be low. The outputs of the inverters 50 and 54 will also be high, and the output of the inverter 52 will be low, thereby causing the inverter 60 to output a high. Note that, in this condition, the circuit is in equilibrium because the OUT*, which is high, is coupled to the high outputs of the inverters 46, 50. Also, the high output of the inverter 60 is coupled to the high output of the inverter 46.

When the IN signal transitions high, the output of the inverter 46 attempts to transition low. However, this high-to-low transition is resisted by the high at the output of the inverter 54, which is coupled through the NMOS transistor 70 in the transistor pair 64. As a result, there is a delay before the transition voltage of the inverter 48 is reached. The magnitude of the delay can be adjusted by adjusting the ON impedance of the NMOS transistor 70 in relation to the impedance of an NMOS transistor (not shown) in the inverter 46. In a similar manner, the output of the inverter 50 attempts to transition low, but is resisted by the high coupled from the OUT* terminal to the input of the inverter 52 through the NMOS transistor 70 in the transistor pair 66. Both transistors 70 of pair 64 and 66 are tuned such that the delays of both branches 40 and 44 match each other over various process and operating conditions. This is not to say that the delays are constant between different processes, but that both branches track each other. Also, each transistor 70 not only compensates the NMOS transistors in inverters 46 and 50 (not shown), but also compensates their respective entire branch. Eventually, the outputs of the inverters 48, 52 transition high, and the output of the inverter 54 transitions low. When the output of the inverter 54 transitions low, the power drain through the transistors 70 in the transistor pairs 64, 66 is eliminated.

When the IN signal transitions low, the outputs of the inverters 46, 50 attempt to transition high, but are held low through the PMOS transistors 72 in the transistor pairs 64, 66, respectively. Again, the magnitude of the resulting delay can be adjusted by adjusting the ON impedance of the PMOS transistors 72 in the transistor pairs 64, 66 in relation to the impedance of a PMOS transistors (not shown) in the inverters 46, 50 respectively. Again, the PMOS transistors 70 are tuned to match the branches. When the outputs of the inverters 48, 52 transition low and the output of the inverter 54 transitions high, the power drain through the transistors 72 in the transistor pairs 64, 66 is eliminated.

The characteristics of the transistor pair 64 are thus preferably set so that the transistor pair 64 counteract for process variations in both of the inverters 46, 48. Similarly, the characteristics of the transistor pair 66 are preferably set so that the transistor pair 66 counteracts process variations in all three of the inverters 50, 52, 54, thereby maintaining the symmetry of the OUT and OUT* signals.

If power drain is not a factor, the phase splitter embodiment 40' shown in FIG. 3 may be used. The phase splitter 40' of FIG. 3 uses the same components as the phase splitter 40 of FIG. 2, and its components have therefore been provided with the same reference numerals. In the phase splitter 40' of FIG. 3, the drains of the NMOS transistors 70 in the transistor pairs 64, 66 are coupled directly to a supply voltage $V_{CC}$ instead of to the output of the inverter 54. As a result, the NMOS transistors 70 continuously bias the outputs of the inverters 46, 50 high to delay the high-to-low transitions at the outputs of the inverters 46, 50. Since both transistors 70 are tuned so that the delays of the branches 40 and 44 match each other over various process and operating conditions, each transistor 70 not only compensates the NMOS transistors in inverters 46 and 50 (not shown), but also compensates their respective branches.

The phase splitter 40' of FIG. 3 also differs from the phase splitter 40 of FIG. 2 by the coupling the drains of the PMOS transistors 72 to ground instead of to the output of the inverter 54. Again, the PMOS transistors 72 continuously bias the outputs of the inverters 46, 50 low to delay the low-to-high transitions at the outputs of the inverters 46, 50, thereby compensating the PMOS transistors in inverters 46 and 50 and compensating for process variations in their respective branches.

As mentioned above when describing the prior art phase splitter 12 of FIG. 1, the speed of the inverter 46 will generally be relatively slow compared to the speed of the inverters 50, 54. As a result, the signal at the output of the inverter 46 would have a relatively slow slew rate, thereby necessitating the inverter 48 be relatively large to produce an OUT signal having a sufficiently fast slew rate. However, in the embodiment of a phase splitter 40 shown in FIG. 2, the presence of the inverter 60 allows the inverter 48 to be relatively small and still produce an OUT signal having a relatively fast slew rate. This is accomplished by using the output of the inverter 60 to assist each transition at the output of the inverter 46. More specifically, when the IN signal transitions high, the output of the inverter 46 transitions low and the output of the inverter 52 subsequently transitions high. As a result, after a short delay, the output of the inverter 60 transitions low to complement the low output of the inverter 46. Thus, in response to the IN signal transitioning high, the output of the inverter 46 initially transitions low with a relatively slow slew rate. After a short delay, the high-to-low transition at the output of the inverter 60 substantially increases the slew rate. In this is faster slew rate to which the inverter 48 responds thereby producing the OUT signal with a sufficiently fast slew rate. The embodiment of the phase splitter 40 illustrated FIG. 2 is thus substantially insensitive to process variations and is able to provide symmetrical OUT and OUT* signals without the use of large transistors.

An alternative embodiment of a phase splitter 80 is shown in FIG. 4. The phase splitter 80 includes many of the components that are used in the phase splitter 40 of FIG. 2. Therefore, in the interest of brevity, an explanation of these components will not be repeated. The phase splitter 80 includes two additional inverters 84, 86. The transistor pair 72 remains coupled to the output of the inverter 54. However, the transistor pair 64 is now coupled to the output of the inverter 86, which generates the OUT* signal. Since each inverter 54, 86 drives only a single transistor pair 64 or 66, the transistors in the inverters 54, 86 may be smaller than the transistors in the inverter 54 used in the phase splitter 40 of FIG. 2. Alternatively, the inverters 54, 86 may be the same size, but the size of the transistors 70, 72 in each transistor pair 64, 66 can be smaller because each inverter 54, 86 is loaded by only a single transistor pair 64, 66.

As with the phase splitter 40' of FIG. 3, the embodiment of FIG. 5 may be used if power drain is not a factor. The phase splitter 80' of FIG. 5 differs from the phase splitter 80 of FIG. 4 in the same manner that the phase splitter 40' of FIG. 3 differs from the phase splitter 40 of FIG. 2. Specifically, the drains of the NMOS transistors 70 in the transistor pairs 64, 66 are coupled directly to a supply voltage $V_{CC}$ instead of to the output of the inverter 54, and the drains of the PMOS transistors 72 are coupled directly to ground instead of to the output of the inverter 54. As explained above with reference to FIG. 3, the NMOS transistors 70 and the PMOS transistors 72 continue to compensate the transistors in inverters 46 and 50 and their respective branches.

Another embodiment of a phase splitter 100 is shown in FIG. 6. This embodiment also uses the same components as the phase splitter 40 of FIG. 2, and its components have therefore been provided with the same reference numerals. The phase splitter 100 of FIG. 6, operates in much the same way as the phase splitter 40 of FIG. 3. However, the drains of the NMOS transistors 70 are coupled to the supply voltage $V_{CC}$, and the drains of the PMOS transistors 72 are coupled to ground. These topographical changes alter the operation in two respects. First, the transistors 70, 72 no longer operate as diodes. Second, the current is supplied to the outputs of the input inverters 46, 50 from either VCC or ground rather than by the inverter 54. As a result of the reduced current demand, the inverter 54 may be made sufficiently smaller.

In operation, the NMOS transistors 70 initially bias the outputs of the inverters 46, 50 high to delay the high-to-low transitions at the outputs of the inverters 46, 50. When the output of the inverter 54 has transitioned low, the NMOS transistors 70 are turned OFF to conserve power. Similarly, the PMOS transistors 72 initially bias the outputs of the inverters 46, 50 low to delay the low-to-high transitions at the outputs of the inverters 46, 50. When the output of the inverter 54 has transitioned high, the PMOS transistors 72 are turned OFF to conserve power.

Figure 7:
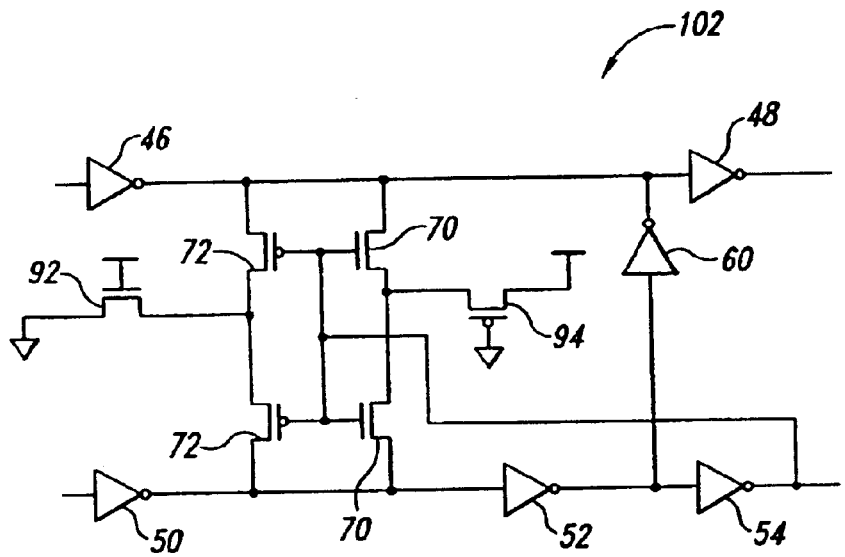
FIG. 7 is a logic diagram of phase splitters according to still another embodiment of the invention.

Still another embodiment of a phase splitter 102 is shown in FIG. 7. The topography of this embodiment is identical to the phase splitter 100 of FIG. 6 except that the drains of the NMOS transistors 70 are coupled to ground through an NMOS transistor 92, and the drains of the PMOS transistors 72 are coupled to $V_{CC}$ through a PMOS transistor 94. The ON resistance of the transistors 92, 94 provide electrostatic discharge ("ESD") protection. In all other respects, the phase splitter 102 operates in the same manner as the phase splitter 100 of FIG. 6. The phase splitter 102 of FIG. 6 can also be provides with inherent ESD protection by increasing the gate to contact spacing for the transistors 70, 72 on the drain side.

Although several specific examples of phase splitters according to the invention have been provided, it will be understood that a wide variety of other circuit topographies may be used. For example, one or both of the diode-coupled transistors 70, 72 may be reversed so that the gates of the transistors 70, 72 in the transistor pairs 64 are coupled to the output of the inverter 46, and the gates of the transistors 70, 72 in the transistor pair 66 are coupled to the output of the inverter 50. Additionally, the inverter 60 may be used without the transistor pairs 64, 66 to increase the slew rate of the signal applied to the inverter 48, and the transistor pairs 64, 66 may be used without the inverter 60 to compensate for process variations in the inverters 30, 32, 50–54.

In the field of semiconductors, it is common to scale up or down the size of components in circuits depending upon the load to be driven by the circuit. Thus, the inverters used in the phase splitters 40, 40', 80, 80', 100, 102. However, as also understood in the art, there is a limit to how small semiconductor components can be scaled. Thus, when the phase splitters 40, 40', 80, 80', 100, 102 are scaled to their minimum size, the relative size of the inverters can change. In particular, the output inverters 48, 54 can continue to be scaled downwardly beyond the point that the input inverters 46, 50 can no longer be scaled down. When scaling semiconductor circuits in this manner, it is desirable for the timing relationships in the circuit to be insensitive to the scaling. However, when the ratio of the scaling of the output inverters 48, 54 to the scaling of the input inverters 46, 50 changes because the input inverters 46, 50 have reached their minimum sizes, the timing relationships in the phase splitter change. The timing relationship changes because the input inverters 46, 50 have been made larger relative to the size of the output inverters 48, 52, and are thus more easily able to drive the output inverters 48, 52. The signal from the output inverters 48, 52 thus transitions earlier relative to the transition of a clock signal applied to the input of the input inverters 46, 50. As a result, the scaling of the phase splitter alters the timing of the phase splitter.

Figure 8:
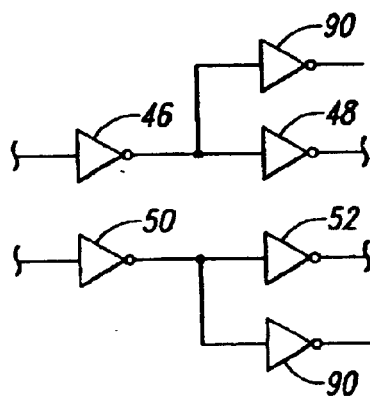
FIG. 8 is a logic diagram of phase splitters according to another embodiment of the invention that is based on a modifications of the phase splitters of FIGS. 2–7.

The timing relationships in the phase splitters 40–102 can be made insensitive to the scaling of the phase splitters as shown in FIG. 8, which shows pertinent portions of the phase splitters of FIGS. 2–7. An inverter 90 is coupled to the output of each input inverter 46, 50 to increase the load that is driven by the input inverters 46, 50. The inverters 90 are sized independently, if necessary, so that the switching times of the inverters 46–54 remain constant as the output inverters 48, 52 are scaled downwardly beyond the point where the input inverters 46, 50 can be scaled further. Since the inverters 90 are used only for loading the input inverters 46, 50, the outputs of the inverters 90 may be left unconnected to any other circuitry. However, if it is desired to couple the outputs of the inverters 90 to other circuitry, the inverters 90 can be used for this purpose. Although inverters 90 are used to load the inverters 46, 50 in the embodiment of FIG. 8, it will be understood that other components, such as capacitors, can be used for that purpose.

Figure 9:
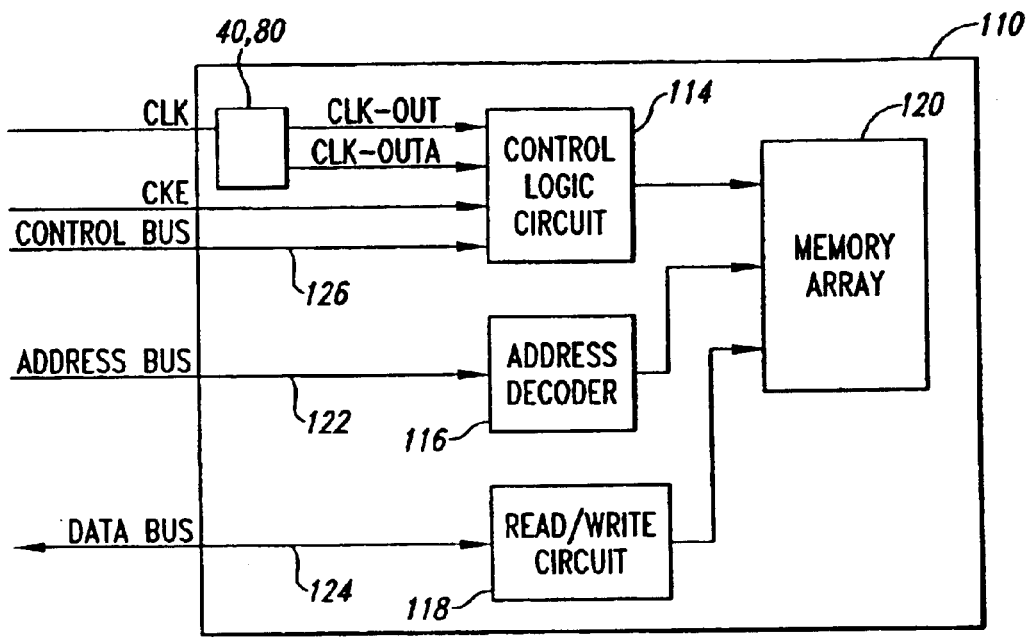
FIG. 9 is a block diagram of an embodiment of a synchronous dynamic random access memory that uses one or more of the phase splitters shown in FIG. 2–8.

The phase splitters 40–102 may be used in a variety of devices, including, as shown in FIG. 9, a synchronous dynamic random access memory 110 ("SDRAM"). The SDRAM 110 includes a control logic circuit 114, an address decoder 116, and a read/write circuit 118, all of which are coupled to a memory array 120. As is well known in the art, the address decoder 116 receives an address over an address bus 22 and provides a decoded address to the memory array 120 to select an individual memory cell in the memory array. The read/write circuit 118 operates to receive data over a data bus 124 and provide that data to the memory array 120 during a write operation, and to provide data from the memory array to the data bus during a read operation.

The SDRAM 110 performs data transfer operations under control of the control logic circuit 114 which receives data transfer commands, including read or write commands, over a control bus 126. In response to these data transfer commands, the control logic circuit 114 executes each of the steps required to perform a read or write data transfer operation. The SDRAM 110 also receives a CLK to control the timing of various operations. The CLK signal is converted to complimentary clock signals CLK-OUT and CLK-OUT* by one of the phase splitters 40, 80 or some other embodiment of a phase splitter (not shown) according to the invention. These CLK-OUT and CLK-OUT* signals are applied to the control logic circuit 114 to cause the control logic circuit 114 to synchronously execute one or more memory operations twice for each cycle of the CLK signal. These operations are performed at intervals that are spaced substantially equally from each other because of the symmetry of the CLK-OUT and CLK-OUT* signals provided by the phase splitter 40 or 80. A clock enable signal CKE enables the clocking of the control logic circuit 114 by the CLK-OUT and CLK-OUT* signals.

Figure 10:
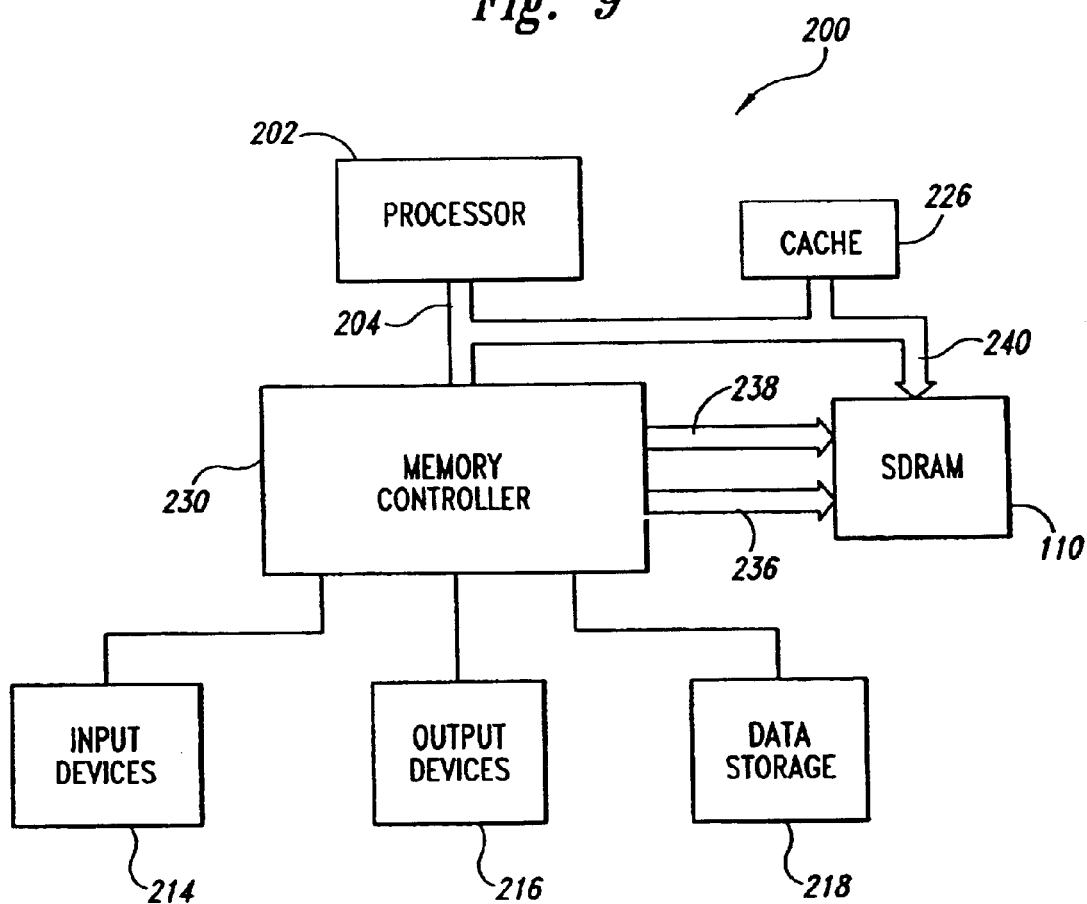
FIG. 10 is a block diagram of an embodiment of a computer system using the SDRAM of FIG. 9.

FIG. 10 shows a computer system 200 containing the SDRAM 110 of FIG. 9 using one of the phase splitters 40–102 or some other embodiment of a phase splitter (not shown) according to the invention. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM") and to the SDRAM 110 through a memory controller 230. The memory controller 230 normally includes a control bus 236 and an address bus 238 that are coupled to the SDRAM 110. A data bus 240 may be coupled to the processor bus 204 either directly (as shown), through the memory controller 230, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of scaling a circuit having at least a first logic component driving a second logic component, the method comprising:

downwardly scaling the first logic component;

downwardly scaling the second logic component to a greater extent than the scaling of the first logic component so that the second logic component is scaled to a greater extent than the first logic component; and coupling an electrical loading component to the output of the first logic component, the electrical component being unconnected to any other portion of the circuit, the electrical loading component maintaining a timing relationship between the first and second logic components.

2. The method of claim 1, wherein each of the first and second logic components comprises a respective inverters, and wherein the electrical component comprises an inverter.

3. A method of scaling a circuit having at least a first logic component driving a second logic component, the method comprising:

downwardly scaling the first and second logic components, one of the logic components being scaled to a lesser extent than the other of the logic components; and coupling an electrical loading component to the output of the logic component that is scaled to the lesser extent, the electrical component being unconnected to any other circuitry that is coupled to the first and second logic components.

4. The method of claim 3 wherein a characteristic of the electrical loading component is selected to maintain a timing relationship between the first and second logic components.

5. The method of claim 3 wherein the act of downwardly scaling the first and second logic components comprises downwardly scaling the first logic component to a lesser extent than the downward scaling of the second logic component.

6. The method of claim 3 wherein the act of coupling an electrical loading component to the output of the logic component that is scaled to the lesser extent comprises coupling an input terminal of an inverter to the output of the logic component that is scaled to the lesser extent, the inverter having an output terminal that is left unconnected to any other portion or the circuitry that is coupled to the first and second logic components.

7. A method of controlling the timing relationship between first and second logic components, the method comprising coupling an electrical loading component to the output of one of the logic components, the electrical component being unconnected to any other circuitry.

8. The method of claim 7 wherein the first logic component drives the second logic component.

9. The method of claim 8, wherein the act of coupling an electrical loading component to the output of one of the logic components comprises coupling an electrical loading component to the output of the first logic component.

10. The method of claim 3 wherein the act of coupling an electrical loading component to the output of one of the logic components comprises coupling an input terminal of an inverter to an output of one of the logic components, the inverter having an output terminal that is left unconnected to any other circuitry.

* * * * *